United States Patent

Peroni

[11] Patent Number: 5,971,507
[45] Date of Patent: Oct. 26, 1999

[54] RELAY RACK ENCLOSURE

[75] Inventor: Peter A. Peroni, Pottstown, Pa.

[73] Assignee: LaFrance Corporation, Philadelphia, Pa.

[21] Appl. No.: 09/072,258

[22] Filed: May 4, 1998

[51] Int. Cl.⁶ .................................................. A47B 81/00
[52] U.S. Cl. ........................ 312/223.2; 312/263; 292/80; 211/26; 220/786
[58] Field of Search ................................ 312/222, 223.1, 312/223.2, 290, 111, 265.6, 265.5, 263; 361/683, 684, 724, 725, 726, 727; 292/19, 80, 83, 86; 211/26, 189, 191, 184; 220/786, 782, 780

[56] References Cited

U.S. PATENT DOCUMENTS

| | | | |
|---|---|---|---|
| 4,102,554 | 7/1978 | Reimer | 312/265.5 X |
| 4,553,674 | 11/1985 | Yoshikawa et al. | 211/26 |
| 4,690,286 | 9/1987 | Horne et al. | 211/26 X |
| 4,717,216 | 1/1988 | Hornak | 312/326 |
| 4,938,513 | 7/1990 | Gunderson | 292/80 |
| 5,269,598 | 12/1993 | Liu | 312/223.2 |
| 5,312,005 | 5/1994 | O Dell | 211/26 X |
| 5,348,356 | 9/1994 | Moulton | 292/80 |
| 5,369,549 | 11/1994 | Kopp et al. | 312/263 X |
| 5,577,779 | 11/1996 | Dangel | 292/80 |
| 5,735,411 | 4/1998 | Flamme et al. | 312/223.1 X |
| 5,743,606 | 4/1998 | Scholder | 312/223.2 |
| 5,785,398 | 7/1998 | Park | 312/223.2 |
| 5,839,804 | 11/1998 | Ho | 312/223.2 |

*Primary Examiner*—Peter M. Cuomo
*Assistant Examiner*—James O. Hansen
*Attorney, Agent, or Firm*—Connolly Bove Lodge & Hutz LLP

[57] ABSTRACT

A relay rack enclosure includes a top cover and bottom cover each of which has end walls which are detachably locked together. The locking structure includes a resiliently mounted cantilevered pawl having a locking tooth which is provided on one of the end walls for detachable engagement in a slot on the abutting end wall of the other cover. A panel is mounted to the covers by tabs in the covers fitting into slots in perpendicular extensions of the panel.

29 Claims, 5 Drawing Sheets

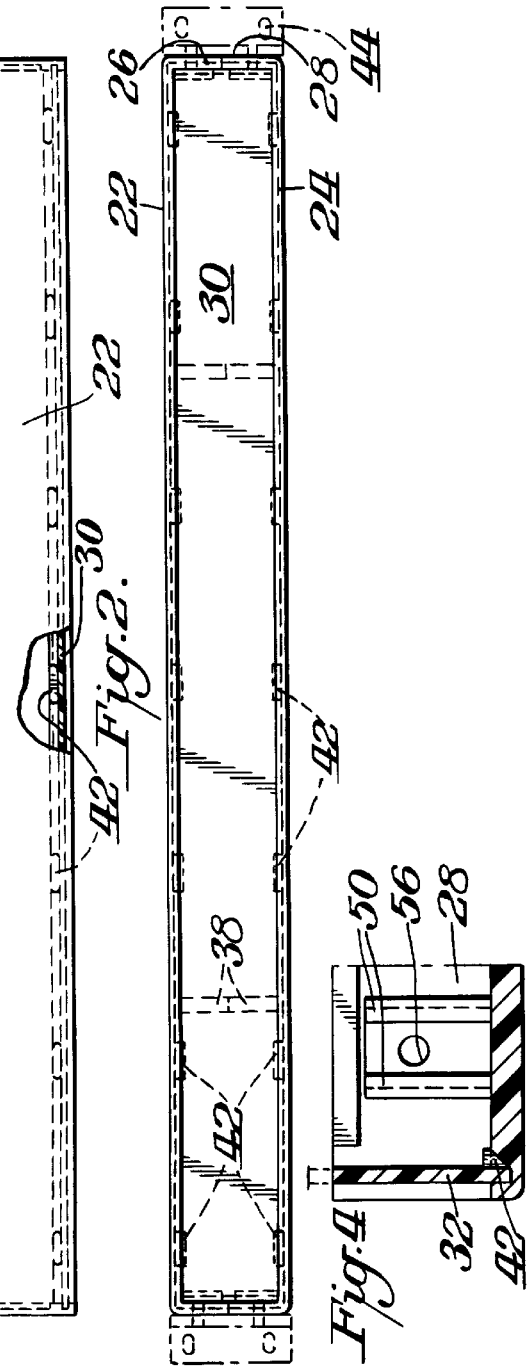

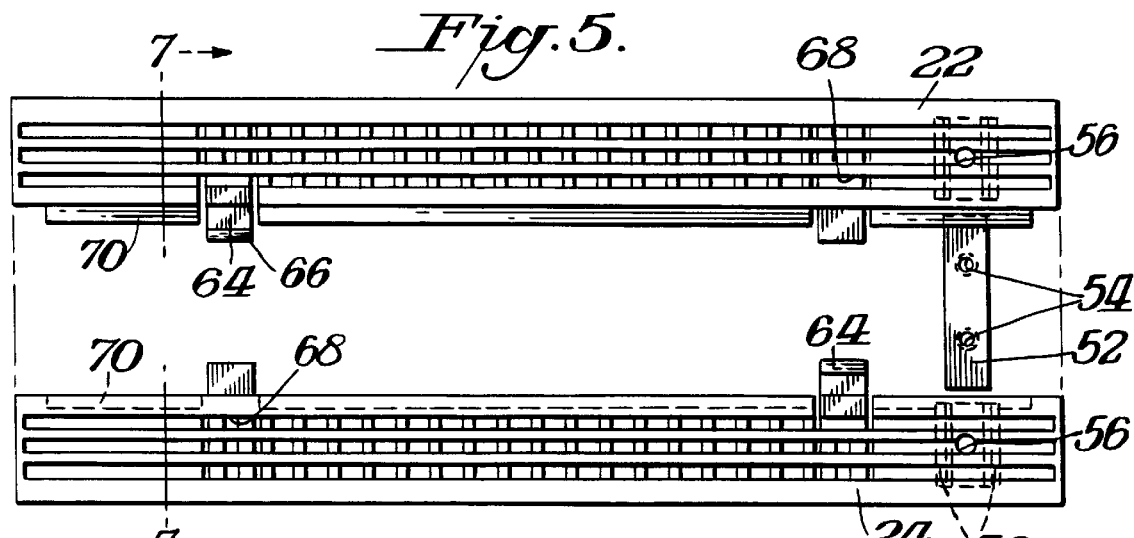
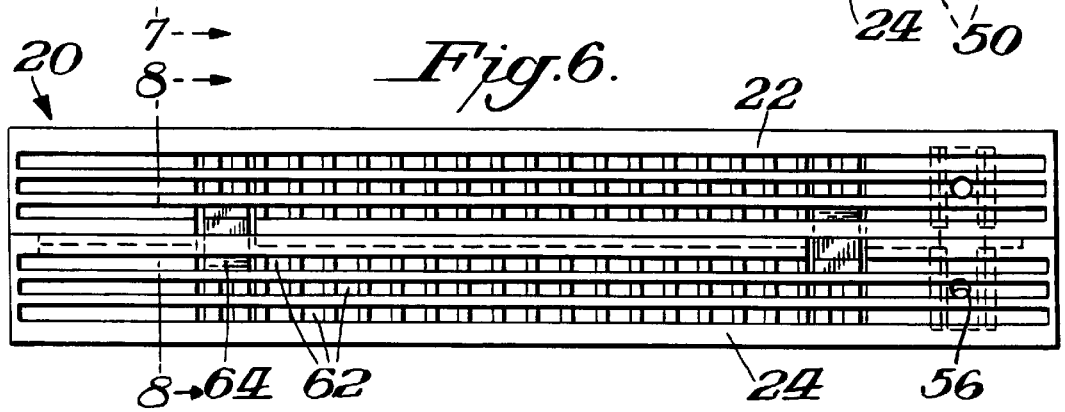
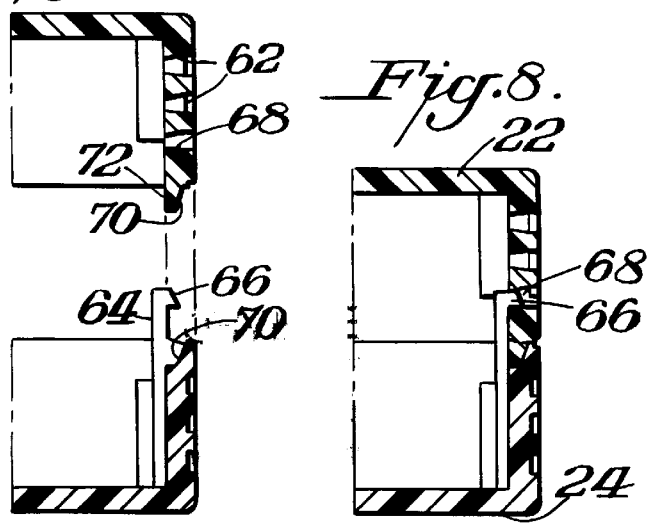

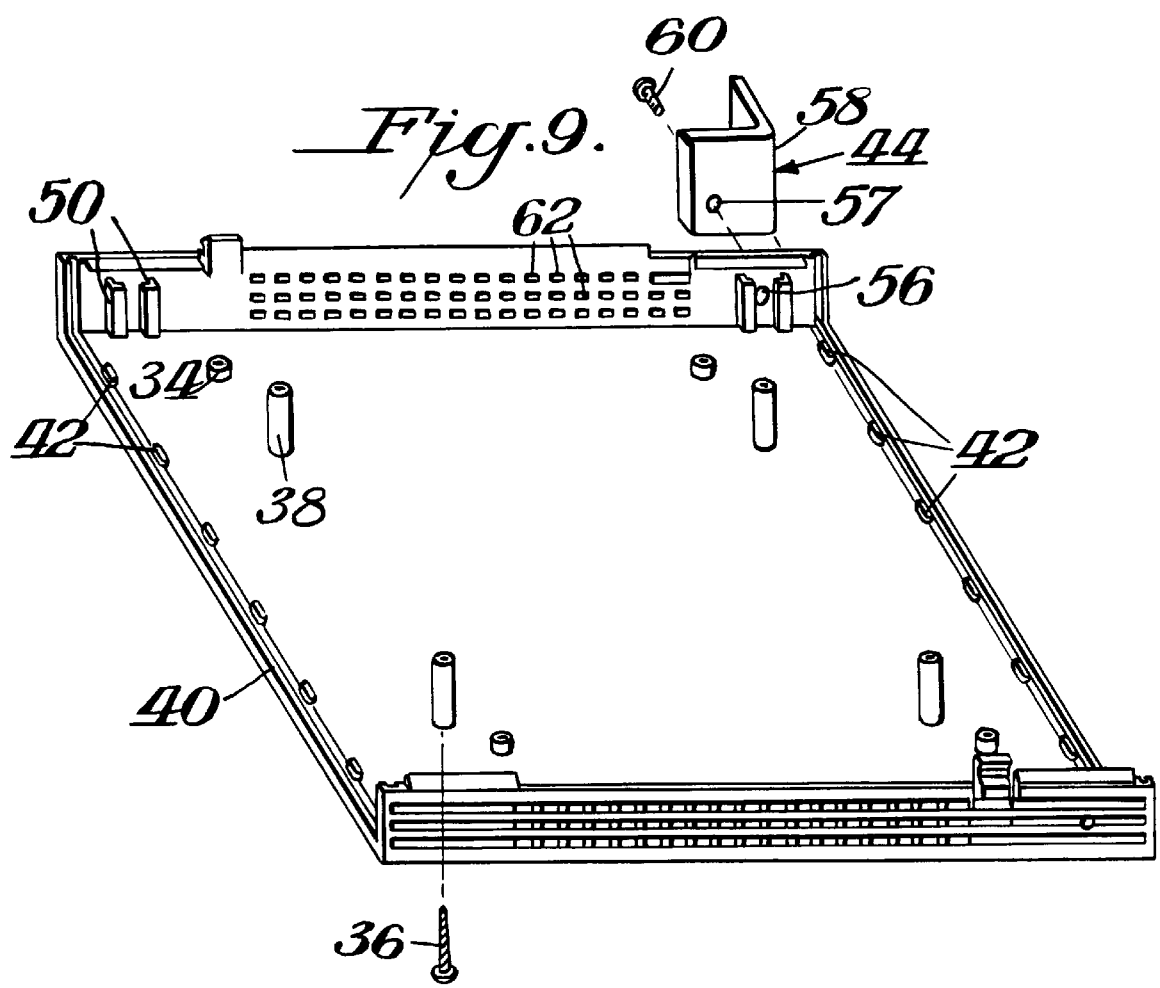
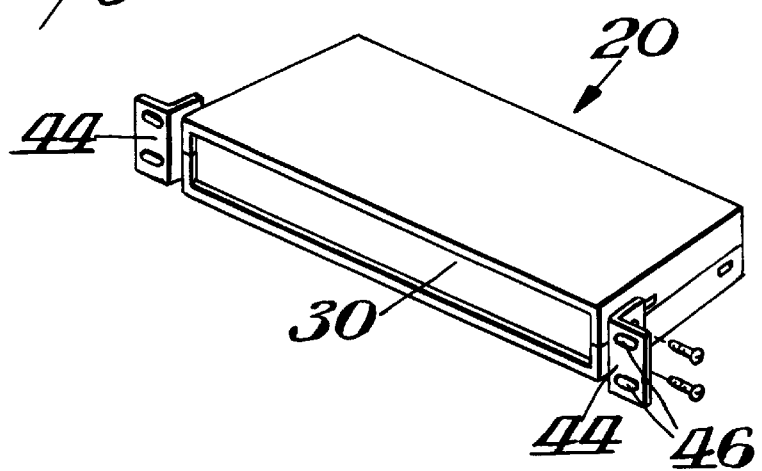

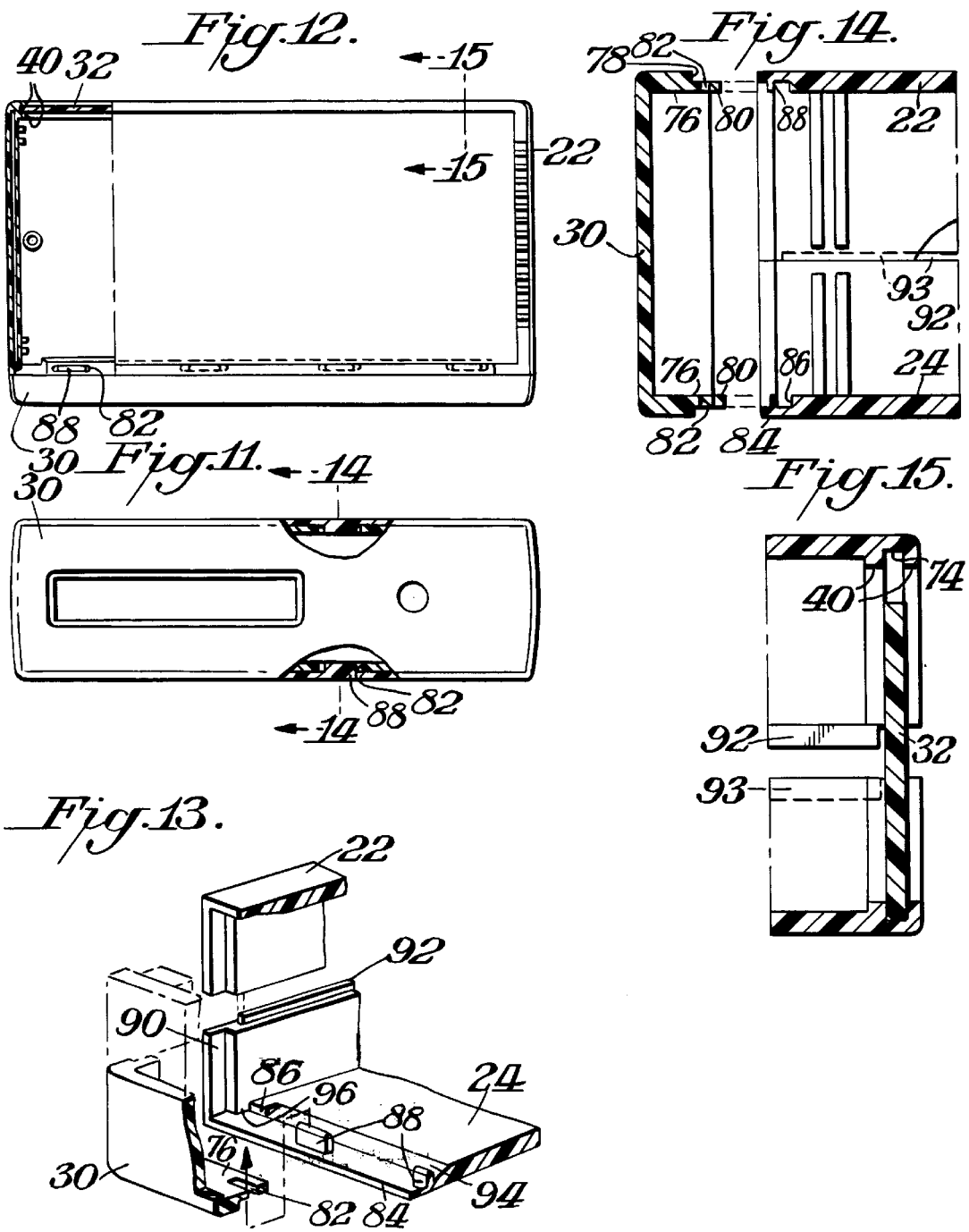

RELAY RACK ENCLOSURE

BACKGROUND OF THE INVENTION

Various electronic components, such as printed circuits are mounted in enclosures which in turn are secured to rails of relay rack cabinets. Ideally, such enclosures should be easy to assemble with the electronic components therein and when necessary easy to disassemble. Conventionally, various types of fasteners, such as threaded fasteners are used to mount the top and bottom covers together. Once the enclosure is assembled it should also be easy to mount the enclosure in a reliable manner in the cabinet rack and similarly it should be easy to remove the enclosure. Such enclosure preferably should be shallow so that a large number of enclosures could be mounted in a single cabinet. Ideally such enclosures should also be inexpensive to make without detracting from their reliability.

SUMMARY OF THE INVENTION

An object of this invention is to provide a relay rack enclosure which meets the above needs.

A further object of this invention is to provide such an enclosure which readily be mounted in a cabinet or be placed on a desk or other support surface.

A still further object of this invention is to provide such an enclosure which could be readily and efficiently assembled and similarly disassembled.

In accordance with this invention the enclosure includes mirror image top and bottom cover. The top cover has downwardly depending end walls at each end while the bottom cover has upwardly extending end walls at each end for abutment with a respective top wall end cover. The abutting end walls are secured together by detaching locking structure in the form of a resiliently mounted pawl having a locking piece which is mounted in cantilevered fashion from one end wall for selective engagement in a slot in the abutting end wall of the other cover. In this manner the end walls and thus the covers are snapped together for positive securement. When it is necessary to disassemble the covers the pawl is pushed out of its slot and the covers could be moved apart.

In a preferred practice of the invention the covers are made of a molded plastic material. A mounting bracket is mounted externally to the enclosure at each end thereof for mounting the enclosure in the rails of a cabinet. The mounting bracket is mounted by means of a nut plate pocket secured on the inner surface of an end wall so that a bolt or other suitable fastener could extend through a hole in the bracket and engage a nut in the plate trapped in the pocket.

In accordance with a further preferred practice of this invention, the panels are mounted to the remainder of the housing by providing perpendicular extensions to the panels with the extensions having slots that fit over tabs on the covers.

THE DRAWINGS

FIG. 2 is a front elevational view of a relay rack enclosure in accordance with this invention;

FIG. 3 is a top plan view of the enclosure shown in FIG. 2;

FIG. 4 is a cross-sectional view taken through FIG. 3 along the line 4—4;

FIG. 5 is an exploded end elevational view of the enclosure shown in FIGS. 2–4;

FIG. 6 is an end elevational view similar to FIG. 5 showing the end walls assembled together;

FIG. 7 is a cross-sectional view taken through FIG. 5 along the line 7—7;

FIG. 8 is a cross-sectional view taken through FIG. 6 along the lines 8—8;

FIG. 9 is a perspective view of the bottom cover;

FIG. 10 is a perspective view of the assembled enclosure;

FIG. 11 is a front elevational view partly broken away showing an alternative form of enclosure in accordance with this invention;

FIG. 12 is a top plan view partly broken away of the enclosure shown in FIG. 11;

FIG. 13 is a fragmental exploded perspective view showing various components in the enclosure of FIGS. 11–12;

FIG. 14 is a cross-sectional view taken through FIG. 11 along the line 11—11; and FIG. 15 is a cross-sectional view taken through FIG. 12 along the line 15—15.

DETAILED DESCRIPTION

Figure 1:
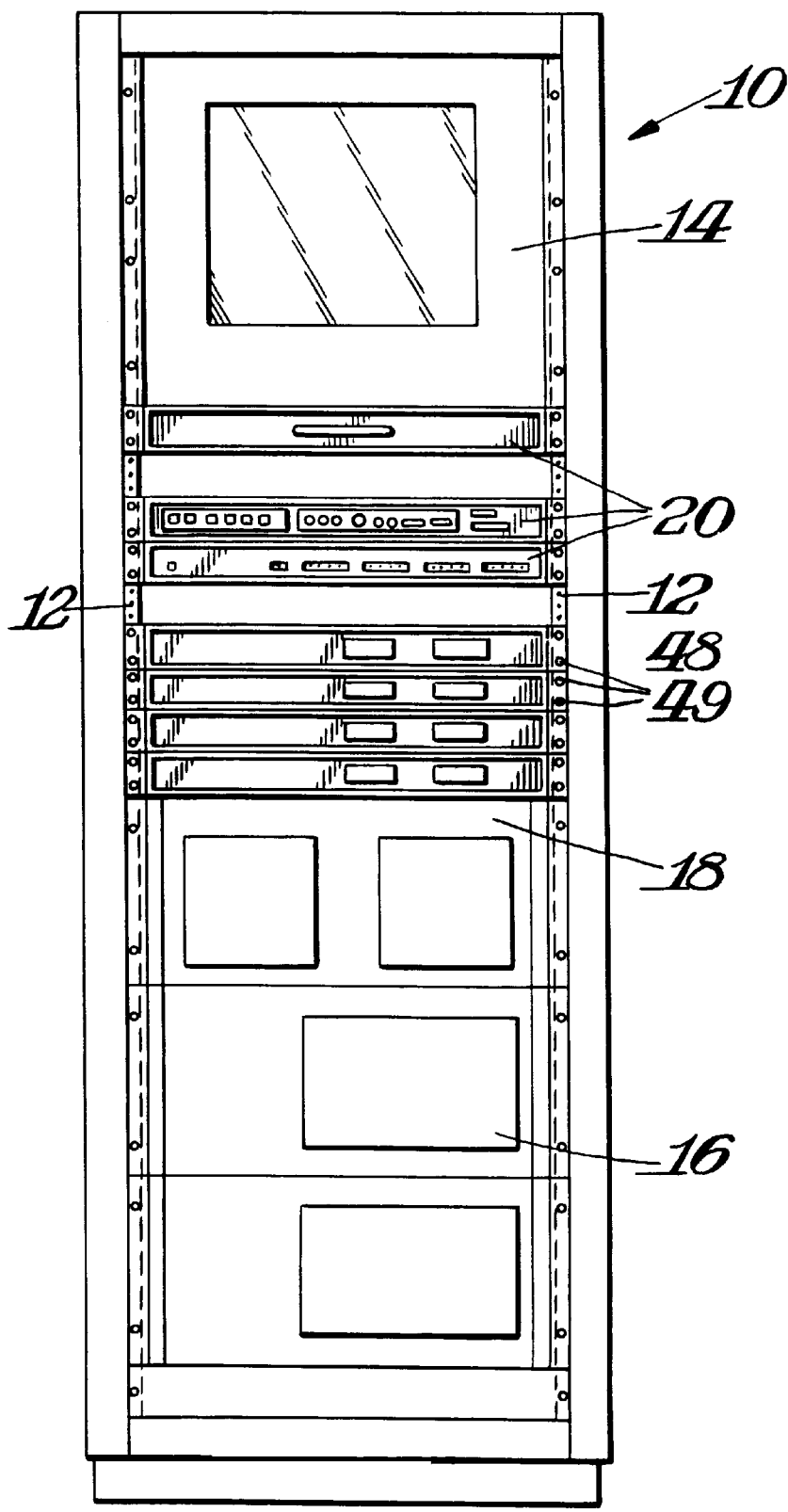
FIG. 1 is a front elevational view showing a rack cabinet which includes relay rack enclosures in accordance with this invention.

FIG. 1 illustrates a rack cabinet 10 for holding various equipment. The rack cabinet 10 includes a rack 12 on the inner surface of each side wall. A plurality of enclosures 20 are mounted in the racks as later described. Other equipment which could be included in the enclosure might be, for example, a monitor rack 14, network server chassis 16, cd-rom server rack chassis 18 and other conventional equipment.

The present invention relates to the structure for the relay rack enclosure 20. Reference is made to FIGS. 2–10 for the details of enclosure 20.

Enclosure 20 includes a top cover 22 and a bottom cover 24 which are preferably mirror images of each other. Top cover 22 has a downwardly extending end wall 26 at each end while bottom cover 24 has an upwardly extending end wall 28 with a respective end wall 26 and 28 abutting against each other. A front panel 30 is mounted between the top and bottom covers and their end walls while a rear panel 32 is similarly mounted.

The inner surface of each cover includes known mounting members 34 for receiving various electronic components such as circuit boards and the like. If desired, the covers may be additionally secured together by means of fasteners 36 extending through mating hollow cylindrical posts 38 provided on the top and bottom covers in a known manner.

Panels 30,32 are mounted in peripheral grooves formed in the top and bottom covers. In a preferred practice of the invention the peripheral grooves result from an upstanding lip or flange 40 at the outer edge of each cover along the top, bottom and end walls of the assembled covers. A plurality of tabs or tongues 42 aligned with each other are spaced inwardly from flange 40 to thereby create a groove of generally the same thickness as the respective panel 30,32. Preferably, the top and bottom covers are molded of a suitable material such as ABS while the panels 30,32 may be made of metal.

As shown in various figures such as FIG. 10, which illustrates the assembled enclosure 20 a mounting bracket 44 is secured to each end of enclosure 20 generally in line with front panel 30. Mounting bracket 44 includes a pair of holes such as slot 46 for alignment with holes 48 in the rack shown in FIG. 1 so that the enclosure could be firmly mounted to the rack in cabinet 10 by means of suitable fasteners (not shown).

FIGS. 3, 4, 5 and 9 best illustrate the manner of securing bracket 44 to the cover members 22,24. As shown therein each end wall is provided with a pocket or receptacle formed by a pair of L-shaped flanges 50. A nut plate 52 is slidably mounted in the pocket and firmly held in place. FIG. 5, for example, illustrates the nut plate about to be positioned in the pocket of the top cover and then would be positioned in the aligned pocket of the bottom cover. The nut plate has a pair of threaded nuts 54 each of which would be aligned with a hole 56 in the pair of covers. Bracket 44 is of generally L-shape with a leg 58 disposed against the abutting end walls. Leg 58 has a pair of holes which are then aligned with the corresponding holes 56 and nuts 56 so that a threaded fastener 60 could be inserted through the aligned holes and nut and thereby firmly mount the bracket 44 to the pair of end walls. Although pockets with the L-shaped flanges 50 are only necessary at the front of the enclosure 20 for manufacturing purposes, pockets are formed at both the front and rear so that the mirror image covers could be readily assembled without requiring any special orientation as to front and rear.

A further advantage of the nut plate 52 is that it serves to initially align the end walls during the assembly steps.

As shown in FIGS. 5, 6 and 9 the end walls 26,28 are louvered in the sense of having a pattern of holes or openings 62 extending completely therethrough.

FIGS. 7–9 best illustrate the manner of detachably securing upper cover 22 and lower cover 24 together. As shown therein each end wall includes a resilient cantilevered pawl 64 having a locking tooth 66. The louvered pattern includes an elongated slot or recess 68 disposed in line with pawl 64. Since pawl 64 is mounted in a cantilevered fashion and is resilient, the pawl is urged inwardly as the end walls are moved toward mating contact with each other. During this movement angled edges 70 act as cam surfaces to facilitate the abutment of one end wall with the other. During the sliding movement tooth 66 rides up the inner surface 72 by being deflected inwardly until the slot or recess 68 is reached whereupon the tooth 66 of pawl 64 snaps into recess 68. In this manner, the end walls are firmly locked together. Such a locking action occurs at four different locations with the pawls located catty-corner from each other on the top cover and similarly catty-corner from each other on the bottom cover. When it is desired to disassemble the covers, the locking teeth 66 of the pawls 64 are pushed inwardly so as to be disengaged from the slots or recesses 68 and the covers can be then spread apart. During the assembly panels 30,32 are placed in sets of grooves and then locked in place by the snap engagement of the pawls in the recesses or slots. Thus, as described above and as shown in FIGS. 5–8 and in particular in FIG. 8, the locking tooth 66 of each pawl snaps into recess 68 with the portion of the cover having recess 68 thus functioning as a seat. Because the enclosure includes a louvered structure formed by the various patterns of slots, one of the slots is located directly in line with the locking tooth. This is clearly shown in FIG. 8 where the locking tooth 66 is exposed to the exterior of the enclosure by means of the slot directly above the seat on which the locking tooth is engaged. This direct access of the locking tooth 66 to the exterior of the enclosure permits the locking tooth to be pushed inwardly as described above by, for example, the pressure of a manipulating tool or any other instrument that could be inserted into that slot.

FIGS. 11–15 show an alternative form of enclosure in accordance with this invention. This embodiment illustrates two alternative manners of securing the panels 30,32 to the remainder of the enclosure. For example, FIGS. 12 and 15 show a conventional manner of mounting panel 32 by providing a pair of continuous flanges or lip 40 on each cover 22,24 to thereby form a groove 74 into which the panel 32 would be inserted.

FIGS. 11, 13 and 14, however, illustrate a unique manner of attaching a panel which represents an important advancement over the art. As shown therein, the panel 30 has a pair of outwardly extending parallel flanges 76 which are recessed at its outer end to form a shoulder 78 and a stepped extension 80. Step extension 80 includes a plurality of spaced, preferably equally spaced, slots 82. Each cover 22,24 terminates in a narrow end portion 84 which extends from shoulder 86. A plurality of upstanding tabs 88 is provided at spaced intervals corresponding to the spacing of the slots 82. The side portion of covers 22,24 terminate in narrowed extensions 90 which are positioned and dimensioned to fit against the extensions 80 of panel 30 when panel 30 is mounted in place. This mounting is accomplished by placing the panel 30 into and against one of the covers 22,24 so that the tabs 88 are inserted through slots 82 and so that the peripheral recessed extensions of the panel and cover fit against each other. The other cover is then inserted against the panel to finish the enclosure. In the mounting of the two covers together a tongue 92 of one cover at one side thereof fits into a corresponding recess 93 in the other cover. See FIGS. 13–14. Since the covers are mirror images the tongue/recess interlock occurs in the reverse positioning on the other side walls of the covers.

Although FIGS. 12–15 illustrate the unique mounting (such as shown in FIGS. 13–14) and the conventional mounting (such as shown in FIG. 15) to be incorporated in the same housing or enclosure the invention may be practiced where the unique mounting is used for both panels. An advantage of the unique mounting is that it provides smoothness and enhances the aestheticness of the enclosure while providing a particularly secure mounting.

As shown in FIG. 13 the covers include tapered portions 94 inwardly of the tabs 88 which in practice would be spaced from the end of the extension 80 of the panel. The corners 96 on the covers would fit into corresponding notches or recesses at the corners of the extension 80.

In the aspect of the invention shown in FIGS. 11, 13 and 14 the end panel thus includes generally perpendicular side extensions on all four edges. The longer sides have slots 82 to accommodate the tabs 88 and also have notched corners to accommodate the corners 96 of the covers. The shorter intermediate sides are recessed as are the longer sides and notched to complement the shape of the covers.

The invention can be practiced with various size enclosures such as for a 19 inch relay rack with variable depth. Preferably, the enclosures are shallow. While the enclosures 20 are made for fitting in the cabinet 10 the enclosures could also be used by sitting on a desk or any other support surface and could include decorative panels. While the drawings illustrate the front and top covers to be horizontal with the covers mirror images of each other, other shapes may be used such as a slanted top cover. The enclosures may be used for LED disk drives and the like.

It is to be understood that the invention may be practiced with modifications of various features shown herein. For example, while the grooves are formed by a continuous peripheral lip at the outer edge of each cover and the plurality of lugs or tabs inwardly the lugs or tabs could be at the outer edge as well as inwardly or the continuous lip could be inward of the lug or flanges.

Among the advantages of the invention is the unique manner of assembly by simply snapping the covers together so that the pawls automatically enter the recesses. Similarly, during this assembly the nut plate has its nut automatically aligned with the holes in the end walls for alignment with the corresponding holes in the mounting bracket. Where the enclosure is used separately from the cabinet it is not necessary to include the mounting bracket.

An advantage of the invention is that the various components can be molded to the covers thus simplifying manufacturing and lowering costs. The use of hollow posts 38 with screws 36 is optional and would be included where extra rigidity is desired.

As can be appreciated enclosure 20 is thus made of components which can be readily and effectively assembled together and similarly can be easily disassembled when desired.

It is to be understood that the invention can be practiced for various types of enclosures, including but not limited to enclosures for electronic components. Accordingly, the invention is not intended to be limited to relay rack enclosures.

What is claimed is:

1. An enclosure comprising a top cover, a bottom cover, said top cover having a downwardly depending end wall at each end thereof, said bottom cover having an upwardly extending end wall at each end thereof in abutment with a respective top cover end wall, detachable locking structure securing each top cover end wall with a respective bottom cover end wall to detachably secure said top cover and said bottom cover together, at least one side panel mounted between said top cover and said bottom cover and said end walls, said locking structure including a pawl on one of said top cover and bottom cover abutting end walls and a recess in the other of said abutting end walls, said pawl having a locking tooth, said pawl being resiliently mounted in a cantilevered manner to permit said pawl to be snapped into said recess and locked in place by said locking tooth to lock said covers together and to permit said pawl to be pushed inwardly out of said recess to detach said covers from each other, a set of said locking structure being provided at each pair of abutting end walls, each of said end walls including one of said pawls disposed near a corner of said covers and one of said recesses disposed at the opposite corner of said covers, a cam surface on each of said end walls to deflect said pawl inwardly during assembly of said covers and then permit said tooth to snap into said recess, and a mounting bracket secured to opposite sets of end walls for mounting said enclosure to a rack.

2. The enclosure of claim 1 wherein at least one end wall of each set of abutting end walls includes a receptacle having a nut plate mounted therein, said set of end walls having a hole aligned with a nut in said nut plate, said bracket having a hole aligned with said end wall hole and said nut, and a fastener extending through said aligned holes and engaged with said nut.

3. The enclosure of claim 2 wherein each of said abutting end walls includes one of said receptacles with its hole, said nut plate includes two holes each of which is in alignment with its respective hole in said end wall, said mounting bracket including two holes each of which is in alignment with said end wall holes and said nuts, and one of said fasteners being engaged in each of said aligned holes and nut.

4. The enclosure of claim 3 wherein said bracket is L-shaped having a pair of generally perpendicular legs, said holes being in one of said legs disposed against said end walls, and at least one hole in the other of said legs for facilitating the mounting of said bracket and said enclosure to a rack.

5. The enclosure of claim 4 wherein said top cover and said bottom cover are mirror images of each other.

6. The enclosure of claim 5 including a panel, said panel having a front wall and a pair of outwardly extending side flanges, each of said side flanges having a set of spaced slots, each of said top cover and said bottom cover including a set of tabs corresponding in spacing to said panel slots, and said panel being mounted to said cover by said tabs extending through said slots.

7. The enclosure of claim 6 wherein said panel includes intermediate flanges extending generally perpendicularly to said front wall and joined to said side flanges, and said intermediate flanges and said side flanges being recessed and fitting against complementary recesses of said top cover and said bottom cover.

8. The enclosure of claim 5 in combination with a relay rack cabinet having a rack on each side of said cabinet, a respective one of said mounting brackets being mounted to each rack to mount said enclosure to said cabinet, and said enclosure having electronic mounting structure.

9. An enclosure comprising a top cover, a bottom cover, said top cover having a downwardly depending end wall at each end thereof, said bottom cover having an upwardly extending end wall at each end thereof in abutment with a respective top cover end wall, detachable locking structure securing each top cover end wall with a respective bottom cover end wall to detachably secure said top cover and said bottom cover together, at least one side panel mounted between said top cover and said bottom cover and said end walls, said locking structure including a pawl on one of said top cover and bottom cover abutting end walls and a recess in the other of said abutting end walls, said pawl having a locking tooth, said pawl being resiliently mounted in a cantilevered manner to permit said pawl to be snapped into said recess and locked in place by said locking tooth to lock said covers together and to permit said pawl to be pushed inwardly out of said recess to detach said covers from each other, and a mounting bracket secured to opposite sets of end walls for mounting said enclosure to a rack.

10. The enclosure of claim 9 wherein at least one end wall of each set of abutting end walls includes a receptacle having a nut plate mounted therein, said set of end walls having a hole aligned with a nut in said nut plate, said bracket having a hole aligned with said end wall hole and said nut, and a fastener extending through said aligned holes and engaged with said nut.

11. The enclosure of claim 10 wherein each of said abutting end walls includes one of said receptacles with its hole, said nut plate includes two holes each of which is in alignment with its respective hole in said end wall, said mounting bracket including two holes each of which is in alignment with said end wall holes and said nuts, and one of said fasteners being engaged in each of said aligned holes and nut.

12. The enclosure of claim 11 wherein said top cover and said bottom cover are mirror images of each other.

13. An enclosure comprising a top cover, a bottom cover, said top cover having a downwardly depending end wall at each end thereof, said bottom cover having an upwardly extending end wall at each end thereof in abutment with a respective top cover end wall, detachable locking structure securing each top cover end wall with a respective bottom cover end wall to detachably secure said top cover and said bottom cover together, at least one side panel mounted between said top cover and said bottom cover and said end walls, said locking structure including a pawl on one of said top cover and bottom cover abutting end walls and a recess in the other of said abutting end walls, said pawl having a locking tooth, said pawl being resiliently mounted in a cantilevered manner to permit said pawl to be snapped into said recess and locked in place by said locking tooth to lock said covers together and to permit said pawl to be pushed inwardly out of said recess to detach said covers from each other, a panel, said panel having a front wall and a pair of outwardly extending side flanges, each of said side flanges having a set of spaced slots, each of said top cover and said bottom cover including a set of tabs corresponding in spacing to said panel slots, and said panel being mounted to said cover by said tabs extending through said slots.

14. The enclosure of claim 13 wherein said panel includes intermediate flanges extending generally perpendicularly to said front wall and joined to said side flanges, and said intermediate flanges and said side flanges being recessed and fitting against complementary recesses of said top cover and said bottom cover.

15. An enclosure comprising a top cover, a bottom cover, said top cover having a downwardly depending end wall at each end thereof, said bottom cover having an upwardly extending wall at each end thereof in abutment with a respective top cover end wall, said covers being mounted to each other, a bracket mounted to each set of abutting end walls at one side of said enclosure, each of said set of end walls including a pocket, a nut plate mounted in said pocket, said set of end walls having a hole aligned with a nut in said nut plate, said bracket having a hole aligned with said end wall hole and said nut, a fastener extending through said aligned holes and engaged with said nut, each of said abutting end walls including one of said receptacles with its hole, said nut plate includes two holes each of which is in alignment with its respective hole in said end wall, said mounting bracket including two holes each of which is in alignment with said end wall holes and said nuts, and one of said fasteners being engaged in each of said aligned holes and nut.

16. The enclosure of claim 15 wherein said bracket is L-shaped having a pair of generally perpendicular legs, said holes being in one of said legs disposed against said end walls and at least one hole in the other of said legs for facilitating the mounting of said bracket and said enclosure to a rack, and said enclosure having electronic mounting structure.

17. An enclosure comprising a top cover, a bottom cover, said top cover having a downwardly depending end wall at each end thereof, said bottom cover having an upwardly extending wall at each end thereof in abutment with a respective top cover end wall, said covers being mounted to each other, a bracket mounted to each set of abutting end walls at one side of said enclosure, each of said set of end walls including a pocket, a nut plate mounted in said pocket, said set of end walls having a hole aligned with a nut in said nut plate, said bracket having a hole aligned with said end wall hole and said nut, a fastener extending through said aligned holes and engaged with said nut, and said top cover and said bottom cover being mirror images of each other.

18. An enclosure comprising a top cover, a bottom cover, said top cover having a downwardly depending end wall at each end thereof, said bottom cover having an upwardly extending wall at each end thereof in abutment with a respective top cover end wall, said covers being mounted to each other, a bracket mounted to each set of abutting end walls at one side of said enclosure, each of said set of end walls including a pocket, a nut plate mounted in said pocket, said set of end walls having a hole aligned with a nut in said nut plate, said bracket having a hole aligned with said end wall hole and said nut, a fastener extending through said aligned holes and engaged with said nut, and a panel, said panel having a front wall and a pair of outwardly extending side flanges, each of said side flanges having a set of spaced slots, each of said top cover and said bottom cover including a set of tabs corresponding in spacing to said panel slots, and said panel being mounted to said cover by said tabs extending through said slots.

19. The enclosure of claim 18 wherein said panel includes intermediate flanges extending generally perpendicularly to said front wall and joined to said side flanges, and said intermediate flanges and said side flanges being recessed and fitting against complementary recesses of said top cover and said bottom cover.

20. An enclosure comprising a top cover, a bottom cover, said top cover having a downwardly depending end wall at each end thereof, said bottom cover having an upwardly extending end wall at each end thereof in abutment with a respective top cover end wall, said covers being mounted to each other, a panel, said panel having a front wall and a pair of peripherally perpendicularly extending side flanges at opposite portions of said front wall, said side flanges having a set of spaced slots, each of said top cover and said bottom cover having a set of spaced tabs corresponding to said spaced slots, said panel being mounted to said covers by said tabs being inserted into said slots, said panel includes intermediate flanges extending generally perpendicularly to said front wall and joined to said side flanges and said intermediate flanges and said side flanges being recessed and fitting against complementary recesses of said top and said bottom cover, and said top cover and said bottom cover being mirror images of each other.

21. A method of assembling an enclosure which comprises a top cover and a bottom cover with each of said covers having integral end walls disposed toward each other to form sets of abutting end walls, one of said abutting end walls including a resilient cantilevered mounted pawl having a locking tooth and its abutting end wall having an aligned recess, engaging said covers together by snapping the tooth of the pawl into the recess, each set of abutting end walls having a receptacle with a nut plate mounted in the receptacle and a hole in the set of abutting end walls in alignment with a nut in the nut plate, mounting the bracket to the set of abutting end walls by securing a fastener through a hole in the bracket in alignment with the hole of the end walls, and engaging a threaded fastener with the nut.

22. The method of claim 21 wherein each of the set of abutting end walls includes a receptacle with a hole for alignment with a second nut in the nut plate and for alignment with a second hole in the fastener, mounting the nut plate in one of the receptacles and using the nut plate as a guide for aligning the end walls together by positioning the nut plate in the receptacle of the other of the set of abutting end walls.

23. An enclosure comprising a molded plastic top cover, a molded plastic bottom cover, said top cover and said bottom cover when in an assembled condition having spaced sides interconnected by spaced ends, a set of detachable locking structure at each of said spaced ends, each of said sets of locking structure comprising a molded plastic seat integral with one of said top cover and said bottom cover and a molded plastic pawl integral with the other of said top cover and said bottom cover, said pawl being resiliently mounted in a cantilevered manner to permit said pawl to be deflected inwardly and to spring back outwardly, said pawl terminating in a locking tooth disposed in a direction facing outwardly with respect to the interior of said enclosure, said locking tooth having an inclined outer edge disposed above a shoulder, said pawl being in line with said seat, an exposed biasing edge at said seat, said exposed biasing edge being between said seat and the base of said pawl to cause said pawl to be deflected toward said interior of said enclosure as said inclined edge of said locking tooth rides against said biasing edge and then said shoulder of said tooth is snapped over said seat when said top cover and said bottom cover are moved toward each other to effectively lock said top cover to said bottom cover, said enclosure having a plurality of slots extending completely therethrough to create a louvered structure, and one of said slots being directly in line with said locking tooth to provide direct access to said locking tooth from the exterior of said enclosure whereby said locking tooth may be deflected by the pressure of a manipulating tool inserted through said one slot to disengage said locking tooth from said seat to permit said top cover and said bottom cover to be disengaged from each other and thereby disassemble said enclosure.

24. The enclosure of claim 23 wherein said one slot is located in said one cover having said seat.

25. The enclosure of claim 24 wherein said top cover has a downwardly depending end wall at each end thereof, and said bottom cover having an upwardly extending end wall at each end thereof in abutment with a respective top cover end wall.

26. The enclosure of claim 25 wherein a set of said locking structure is provided at each pair of abutting end walls.

27. The enclosure of claim 26 wherein each of said end walls includes one of said pawls disposed near a corner of said covers and one of said seats disposed at the opposite corner of said covers.

28. The enclosure of claim 27 including a cam surface on each of said end walls to deflect said pawl inwardly during assembly of said covers and then permit said tooth to snap into said recess.

29. The enclosure of claim 23 wherein said top cover and said bottom cover are mirror images of each other.

* * * * *